US011348613B2

(12) United States Patent
Jones et al.

(10) Patent No.: US 11,348,613 B2
(45) Date of Patent: May 31, 2022

(54) ADDING A CAP-LAYER TO IMPROVE MAGNETIC RECORDING MEDIA

(71) Applicant: SEAGATE TECHNOLOGY LLC, Cupertino, CA (US)

(72) Inventors: Paul M. Jones, Palo Alto, CA (US); Hongbo Wang, Fremont, CA (US); Martin Blaber, Minneapolis, MN (US); Huan Tang, Los Altos, CA (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 611 days.

(21) Appl. No.: 16/240,510

(22) Filed: Jan. 4, 2019

(65) Prior Publication Data

US 2020/0219534 A1 Jul. 9, 2020

(51) Int. Cl.
| | |
|---|---|
| *G11B 5/72* | (2006.01) |
| *C23C 14/08* | (2006.01) |
| *C23C 14/06* | (2006.01) |
| *C23C 14/34* | (2006.01) |
| *H01J 37/34* | (2006.01) |
| *G11B 5/84* | (2006.01) |
| *G11B 5/00* | (2006.01) |

(52) U.S. Cl.
CPC ........ *G11B 5/7264* (2020.08); *C23C 14/0605* (2013.01); *C23C 14/0635* (2013.01); *C23C 14/081* (2013.01); *C23C 14/083* (2013.01); *C23C 14/34* (2013.01); *G11B 5/8408* (2013.01); *H01J 37/3464* (2013.01); *G11B 2005/0021* (2013.01)

(58) Field of Classification Search
CPC ......... G11B 5/72; G11B 5/726; G11B 5/7262; G11B 5/727; G11B 5/8408; G11B 5/851; G11B 2005/0021; H01J 37/3464; C23C 14/083; C23C 14/081; C23C 14/08; C23C 14/0605; C23C 14/34; C23C 14/0635; C23C 14/0036
See application file for complete search history.

(56) References Cited

U.S. PATENT DOCUMENTS

| | | | |
|---|---|---|---|
| 6,565,719 B1 | 5/2003 | Lairson et al. | |
| 6,875,492 B1 | 4/2005 | Pirzada et al. | |
| 8,475,948 B2 * | 7/2013 | Furuta | G11B 5/72 428/833.3 |
| 9,406,329 B1 | 8/2016 | Ho et al. | |
| 2010/0021772 A1 * | 1/2010 | Harkness | G11B 5/8408 428/847 |
| 2013/0163117 A1 * | 6/2013 | Bhatia | C23C 14/48 360/110 |
| 2015/0010781 A1 * | 1/2015 | Katano | G11B 5/72 428/833.3 |

* cited by examiner

*Primary Examiner* — Holly Rickman
(74) *Attorney, Agent, or Firm* — Holzer Patel Drennan

(57) ABSTRACT

Systems and methods for adding a cap-layer to magnetic recording media are described. In one embodiment, the method may include depositing a magnetic recording layer over a substrate, depositing an interface layer over the magnetic recording layer, and depositing a carbon overcoat layer over the interface layer. In some cases, sputter deposition is used to deposit at least the interface layer. In some cases, oxygen is used as a background gas of the sputter deposition.

14 Claims, 6 Drawing Sheets

ADDING A CAP-LAYER TO IMPROVE MAGNETIC RECORDING MEDIA

SUMMARY

The present disclosure is directed to methods and systems for adding a cap-layer to magnetic recording media. Specifically, the present techniques may support using a cap-layer to increase surface reliability on magnetic recording media.

A medium for heat assisted magnetic recording is described. In one embodiment, the medium may include a magnetic recording layer, an interface layer deposited on the magnetic recording layer, and a carbon overcoat layer deposited on the interface layer. In some cases, the interface layer may be referred to as a cap-layer.

In some cases, sputter deposition is used to deposit the interface layer. In some examples, oxygen is used as a background gas of the sputter deposition. In some cases, at least a portion of the interface layer is formed from a material composition comprising at least one of titanium oxide (TiO), silicon monoxide (SiO), tantalum oxide (TaO), and magnesium oxide (MgO).

In some cases, the interface layer is deposited at a predetermined thickness at or between about 0.1 nanometers and about 10 nanometers. In some examples, one or more parameters associated with the depositing of the interface layer is varied during the depositing of the interface layer, the one or more parameters including at least one of a temperature of deposition of the interface layer, a concentration of a background gas present when the interface layer is deposited, one or more material compositions used for the interface layer, a thickness of each of the one or more material compositions, or any combination thereof.

In some cases, a refractive index of the interface layer is set at or between about 0.5 and about 1.6 based at least in part on a material composition used for the interface layer and a thickness of the interface layer, and wherein a refractive index of the carbon overcoat layer is set at or between about 2.0 and about 2.5 based at least in part a thickness of the carbon overcoat layer.

In some cases, an extinction coefficient of the interface layer is set at or between about 0.3 and about 1.3 based at least in part on a material composition used for the interface layer and a thickness of the interface layer, and wherein an extinction coefficient of the carbon overcoat layer is set at or between about 0.1 and about 0.5 based at least in part a thickness of the carbon overcoat layer.

In some cases, the refractive index of the interface layer is based at least in part on a wavelength of a laser configured to shine on the interface layer through the carbon overcoat layer, wherein the wavelength is between about 400 and about 800 nanometers. In some examples, atoms of the interface layer inter-penetrate with carbon atoms of the carbon overcoat layer during the depositing of the carbon overcoat layer.

A method for heat assisted magnetic recording is also described. In one embodiment, the method may include depositing a magnetic recording layer over a substrate, depositing an interface layer over the magnetic recording layer, and depositing a carbon overcoat layer over the interface layer.

A deposition apparatus for forming a storage medium for heat assisted magnetic recording is also described. In one embodiment, the deposition apparatus may be configured to deposit a magnetic recording layer over a substrate, deposit an interface layer over the magnetic recording layer, and deposit a carbon overcoat layer over the interface layer, the deposition apparatus using sputter deposition to deposit at least the interface layer.

The foregoing has outlined rather broadly the features and technical advantages of examples according to this disclosure so that the following detailed description may be better understood. Additional features and advantages will be described below. The conception and specific examples disclose may be readily utilized as a basis for modifying or designing other structures for carrying out the same purposes of the present disclosure. Such equivalent constructions do not depart from the scope of the appended claims. Characteristics of the concepts disclose herein, including their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following a first reference label with a dash and a second label that may distinguish among the similar components. However, features discussed for various components, including those having a dash and a second reference label, apply to other similar components. If only the first reference label is used in the specification, the description is applicable to any one of the similar components having the same first reference label irrespective of the second reference label.

DETAILED DESCRIPTION

The following relates generally to adding a cap-layer (e.g., interface layer) to magnetic recording media. The present techniques include various devices that may be used for magnetic recording of data (e.g., heat assisted magnetic recording (HAMR), etc.).

In some cases, the HAMR media carbon overcoat (COC) layer is deposited at a relatively high temperature. The deposition process may decrease the reliability of the COC layer by lowering its mechanical hardness and decreasing its thermal stability, and as a result decreasing its ability to protect the recording layer from environmental degradation. In some cases, poor COC layer adhesion at writing temperature, while in intermittent contact with head NFT transducer region, leads to COC removal and smearing on the advanced air bearing (AAB).

The present techniques introduce an additional layer between a recording layer and a carbon overcoat COC layer to improve the mechanical reliability of the storage media, without any cost to the signal to noise ratio (SNR). The present techniques of adding the additional layer between the recording layer and the COC layer avoid COC removal and smearing of the COC on the AAB.

The additional layer introduced by the present techniques may be referred to as an interface layer, a cap-layer, or interfacial film. In some cases, the optical aspects of the additional layer may be manipulated based at least in part on the material composition used for the additional layer and a thickness of the additional layer. In some cases, the additional layer may be tuned to allow more optimal recording in conjunction with a COC layer, improving the mechanical performance of the COC layer. In some cases, the additional layer provides a minimal mechanical gradient between a recording layer and the COC layer. In some cases, based at least in part on the material composition used for the additional layer and how the additional layer is deposited, the additional layer provides a smooth gradation from one adjacent material composition to the next instead of an abrupt change between two adjacent material compositions.

Figure 1:
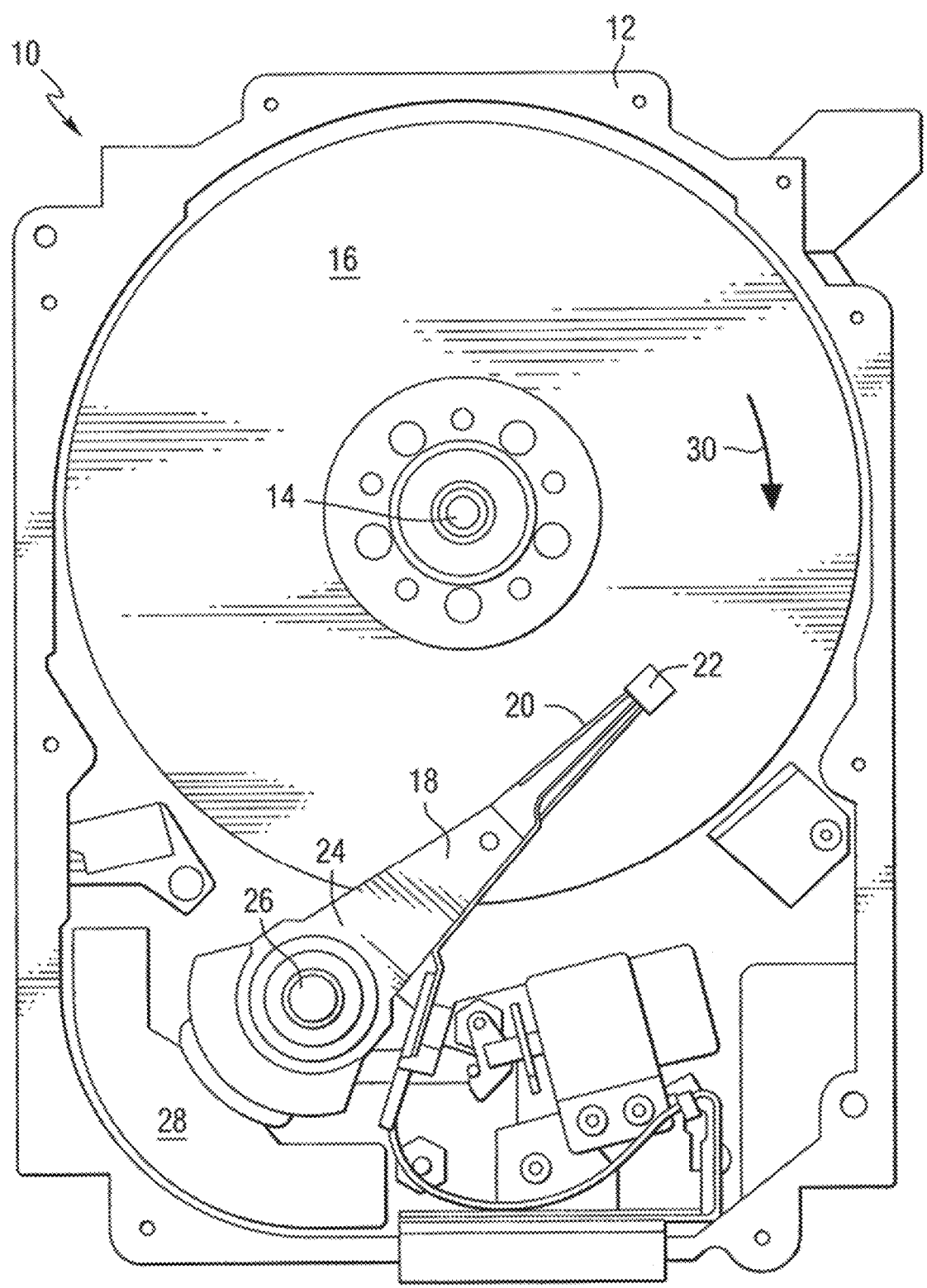
FIG. 1 is a block diagram of an example of a device in accordance with various aspects of this disclosure.

FIG. 1 depicts a data storage device in an exemplary form of a disk drive 10 including a recording head constructed in accordance with an aspect of the present techniques. The storage device includes a housing 12 (with the upper portion removed and the lower portion visible in this view) sized and configured to contain the various components of the disk drive. The disk drive includes a spindle motor 14 for rotating at least one data storage medium 16 (e.g., a magnetic disk) within the housing. At least one arm 18 may be contained within the housing 12, with each arm 18 having a first end 20 and a second end 24. In some cases, the first end 20 may include a recording head 22 (e.g., recording/writing head, a reading head, a reading/recording head, slider with a reading/recording head, etc.). In some cases, a second end 24 may be pivotally mounted on a shaft by a bearing 26. An actuator motor 28 may be located at the arm's second end 24 for pivoting the arm 18 about a pivot point to position the recording head 22 over a desired sector of the storage medium 16. The actuator motor 28 is controlled by a controller that is not shown in this view and is well-known in the art. The storage medium rotates in the direction indicated by arrow 30. As the disk rotates, recording head 22 may be configured to fly over a surface of storage medium 16 on an air bearing between recording head 22 and the surface of storage medium 16.

For heat assisted magnetic recording (HAMR), an electromagnetic wave of, for example, visible, infrared or ultraviolet light may be directed onto a surface of storage medium 16 to raise the temperature of a localized area on a surface of storage medium 16 to facilitate switching of the magnetization of that area. Some designs of HAMR recording heads include a thin film waveguide on a slider (e.g., slider of recording head 22) to guide light to the storage medium for localized heating of the storage medium. To launch light into the waveguide, a grating coupler may be used.

Figure 2:
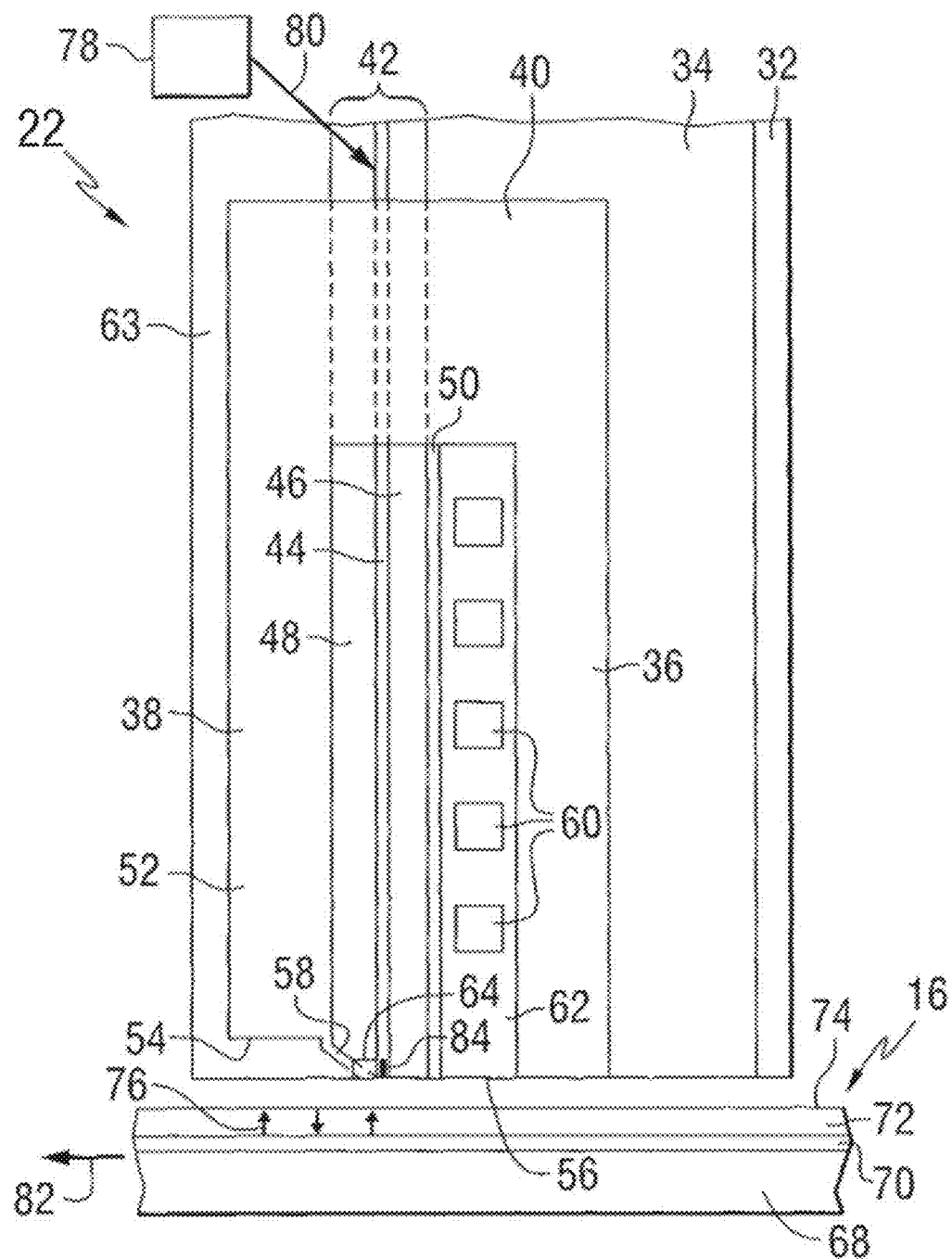
FIG. 2 shows a block diagram of a device in accordance with various aspects of this disclosure.

FIG. 2 is a side elevation view of a recording head 22 constructed in accordance with an aspect of the disclosure, and positioned near a storage media. The recording head 22 includes a substrate 32, a base coat 34 on the substrate, a bottom pole 36 on the base coat, and a top pole 38 that may be magnetically coupled to the bottom pole through a yoke or pedestal 40. In the illustrated example, a waveguide 42 may be positioned between the top and bottom poles. The waveguide includes a core layer 44 and cladding layers 46 and 48 on opposite sides of the core layer. A mirror 50 may be positioned adjacent to one of the cladding layers. The top pole may be a two-piece pole that includes a first portion, or pole body 52, having a first end 54 that is spaced from the air bearing surface 56, and a second portion, or sloped pole piece 58, extending from the first portion and tilted in a direction toward the bottom pole. The second portion may be structured to include an end adjacent to the air bearing surface 56 of the recording head, with the end being closer to the waveguide than the first portion of the top pole. A planar coil 60 may extend between the top and bottom poles and around the pedestal. In the illustrated example, the top pole may serve as a write pole and the bottom pole as a return pole.

In some cases, insulating material 62 may separate the coil turns. In one example, the substrate may be AlTiC, the core layer may be $Ta_2O_5$, and the cladding layers (and other insulating layers) may be $Al_2O_3$. A top layer of insulating material 63 may be formed on the top pole. A heat sink 64 may be positioned adjacent to the sloped write pole 58. The heat sink may be comprised of a non-magnetic material, such as for example Au.

As illustrated in FIG. 2, the recording head 22 may include a structure for heating the magnetic storage medium 16 proximate to where the write pole 58 applies the magnetic write field H to the storage medium 16. In the illustrated example, the storage medium 16 includes a substrate 68, a heat sink layer 70, a magnetic recording layer 72, and a protective layer 74. However, other types of media, such as bit patterned media may be used. A magnetic field H produced by current in the coil 60 may be used to control the direction of magnetization of bits 76 in the recording layer of the media.

In the example, the storage medium 16 is positioned adjacent to or under the recording head 22. The waveguide 42 conducts light from a source 78 of electromagnetic radiation, which may be, for example, ultraviolet, infrared, or visible light. The source may be, for example, a laser diode, or other suitable laser light source for directing a light beam 80 toward the waveguide 42. Various techniques that are known for coupling the light beam 80 into the waveguide 42 may be used. Once the light beam 80 is coupled into the waveguide 42, the light propagates through the waveguide 42 toward a truncated end of the waveguide 42 that is formed adjacent the air bearing surface (ABS) of the recording head 22. Light exits the end of the waveguide and heats a portion of the media, as the media moves relative to the recording head as shown by arrow 82. A near-field transducer (NFT) 84 is positioned in or adjacent to the waveguide and at or near the air bearing surface. The heat sink material may be chosen such that it does not interfere with the resonance of the NFT.

Although the example of FIG. 2 shows a perpendicular magnetic recording head and a perpendicular magnetic storage media, the present techniques may be used in conjunction with other types of recording heads and/or storage media where it may be desirable to concentrate light to a small spot.

Figure 3:
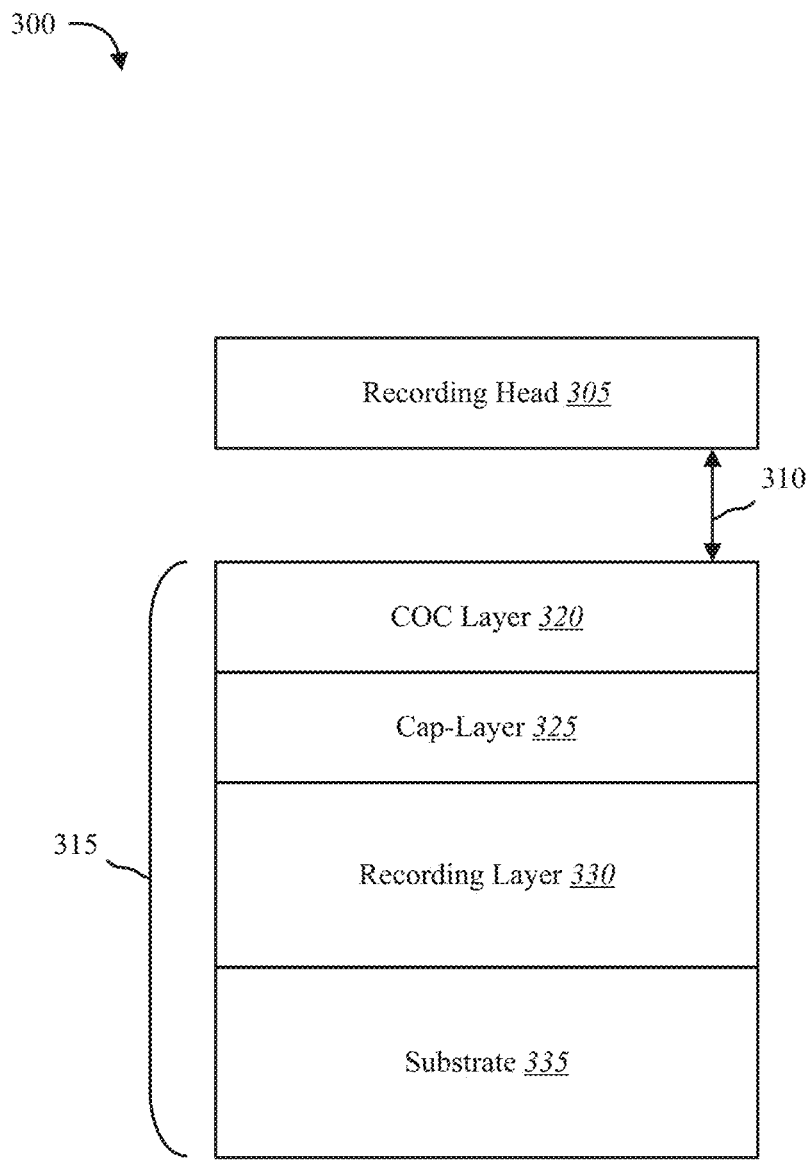
FIG. 3 shows a block diagram of media layers in accordance with various aspects of this disclosure.

FIG. 3 shows a block diagram of environment 300 of a storage device (e.g., disk drive 10 of FIG. 1). Environment 300 may include a recording head 305 (e.g., HAMR recording head), air gap 310 (e.g., air bearing, head-to-media spacing, etc.), and a storage medium 315. In some cases, the storage medium 315 may include a carbon overcoat (COC) layer 320, a cap-layer 325, a recording layer 330, and a substrate 335. As shown, the recording layer 330 may be deposited on substrate 335. In the illustrated example, recording head 305 may be an example of recording head 22 from FIG. 1 and/or FIG. 2. In some cases, storage medium 315 may be an example of storage medium 16 from FIG. 1 and/or FIG. 2. In some case, recording layer 330 may be an example of magnetic recording layer 72 of FIG. 2.

In some cases, the COC layer 320 may be deposited on recording layer 330 at a relatively high temperature (e.g., 150° to 250° Celsius). In some cases, the COC layer 320 may be deposited using sputter deposition, sputtering vapor deposition, pulsed laser deposition, etc. In some cases, the process of depositing COC layer 320 on a recording layer (e.g., recording layer 330) may decrease the reliability of the COC layer 320 by lowering the mechanical hardness and thermal stability of the COC layer 320, resulting in a decreased ability by the COC layer 320 to protect the recording layer 330 from environmental degradation.

The present techniques propose the introduction of a media layer (e.g., cap-layer 325) between the recording layer 330 and the COC layer 320. In some cases, cap-layer 325 may have an overall thickness between 0.1 nm and 10 nm. Putting the cap-layer 325 between the recording layer 330 and the COC layer 320 optimizes the impedance matching between the recording head 305 and storage medium 315 while providing for a more robust COC layer 320 that results in improved protection of the recording layer 330 from environmental degradation.

In one example, a conventional COC layer without a cap-layer may deliver approximately 6.7 Kelvin per nanometer (K/nm) cross track thermal gradient and 6.5 K/nm down track thermal gradient. With the inclusion of the proposed cap-layer 325 a down track thermal gradient of 6.6 K/nm and a cross track thermal gradient of 6.9 K/nm have been achieved. Thus with a nominal cap-layer 325, COC layer 320 may result in beneficial mechanical properties that provide the same level of signal to noise ratio (SNR) performance as a COC layer that lacks a cap-layer.

The present techniques include the use of an additional media layer (e.g., cap-layer 325) between the recording layer 330 and the COC layer 320. The cap-layer 325 layer may be configured to be of sufficient thickness and tuned optical properties to allow the use of a COC layer 320 that provides additional reliability due to its improved mechanical properties introduced by the cap-layer 325. The optical properties of the cap-layer 325 may be chosen to maximize recording performance. In one example, the cap-layer 325 may be composed of at least one of MgO, TiO, SiO, TaO, or any combination thereof. In some cases, the material of the cap-layer 325 may be sputter deposited on recording layer 330. Additionally or alternatively, at least a portion of the cap-layer 325 may be pulsed laser deposited. In some cases, the cap-layer 325 may be deposited using a multitude of deposition sources. In some examples, the cap-layer 325 may be deposited using a particular gas or a mixture of gas as a background (e.g., using an inert gas such as oxygen or argon as a background gas, etc.). In some cases, no gas may be used as a background. The temperature of the deposition of the cap-layer 325 may range from 150° to 250° Celsius. A barometric pressure associated with the gas background (e.g., oxygen background) during deposition of the cap-layer 325 may be set at or between about $1\times10^{-4}$ millibar (mbar) to $1\times10^{-2}$ mbar. In some cases, the cap-layer 325 may be configured such that the refractive index of the cap-layer 325 lies at or within the range of approximately n=0.5 to 1.6, and the extinction coefficient lies at or within the range of approximately k=0.3 to 1.3. In some cases, the optical properties of the cap-layer 325 may be based at least in part on specific properties of the surrounding media layers (e.g., COC layer 320, recording layer 330, etc.) and the writing structures within the recording head 305.

In some examples, cap-layer 325 may be deposited in conjunction with COC layer 320 to allow at least a portion of cap-layer 325 to inter-penetrate, diffuse into, and react with the incoming carbon atoms during deposition of the COC layer 320 after depositing cap-layer 325. Allowing atoms of cap-layer 325 to inter-penetrate and react with atoms of COC layer 320 creates a graded interface between the cap-layer 325 and COC layer 320, in contrast to an abrupt interface between cap-layer 325 and COC layer 320 where there is little to no inter-mingling of atoms between the adjacent layers.

In some cases, due to the energetics of the deposition of the COC layer 320 and the materials chosen for the cap-layer 325 (e.g., TiO, SiO, TaO, MgO, etc.) a sub-layer within the interfacial graded region between cap-layer 325 and COC layer 320 may be composed of carbide between the adhesion layer metal ion of the cap-layer 325 (e.g., outermost layer of cap-layer 325) and the carbon of the COC layer 320. The presence of this chemically bound carbon within the interfacial graded region provides the COC layer 320 with stronger adhesion to cap-layer 325 (e.g., greater adhesion than between COC layer 320 and recording layer 330 without an interfacial cap-layer 325). Also, the chemically bound carbon within the interfacial graded region provides the COC layer 320 with less stress than would otherwise be present during the HAMR writing process. These and other benefits are based at least in part on the graded match of the coefficient of thermal expansion of the COC layer 320 and cap-layer 325 and the relatively strong bond between the COC layer 320 and cap-layer 325.

In some cases, the present techniques may use titanium oxide as an "adhesion" portion of cap-layer 325 between an outermost surface of cap-layer 325 (towards COC layer 320) and COC layer 320. As the COC layer 320 is deposited, TiC is created from this TiO cap-layer 325. In some cases, the interface changes gradually from TiO from cap-layer 325, to dominantly TiC between cap-layer 325 and COC layer 320, to purely carbon of the COC layer 320 in the direction from recording layer 330 to recording head 305. The impact of this gradual change in material properties is reflected in the capability of the cap-layer 325 to support HAMR writing with an acceptable thermal gradient. As a consequence of the cap-layer 325, the COC layer 320 is strongly adhered to the storage medium 315. Furthermore, the gradation of material throughout a portion of the COC layer 320 lessens the stress in the COC layer 320 during high temperature writing, which results in increased durability of the COC layer 320 compared to a COC layer without a cap-layer such as cap-layer 325.

Figure 4:
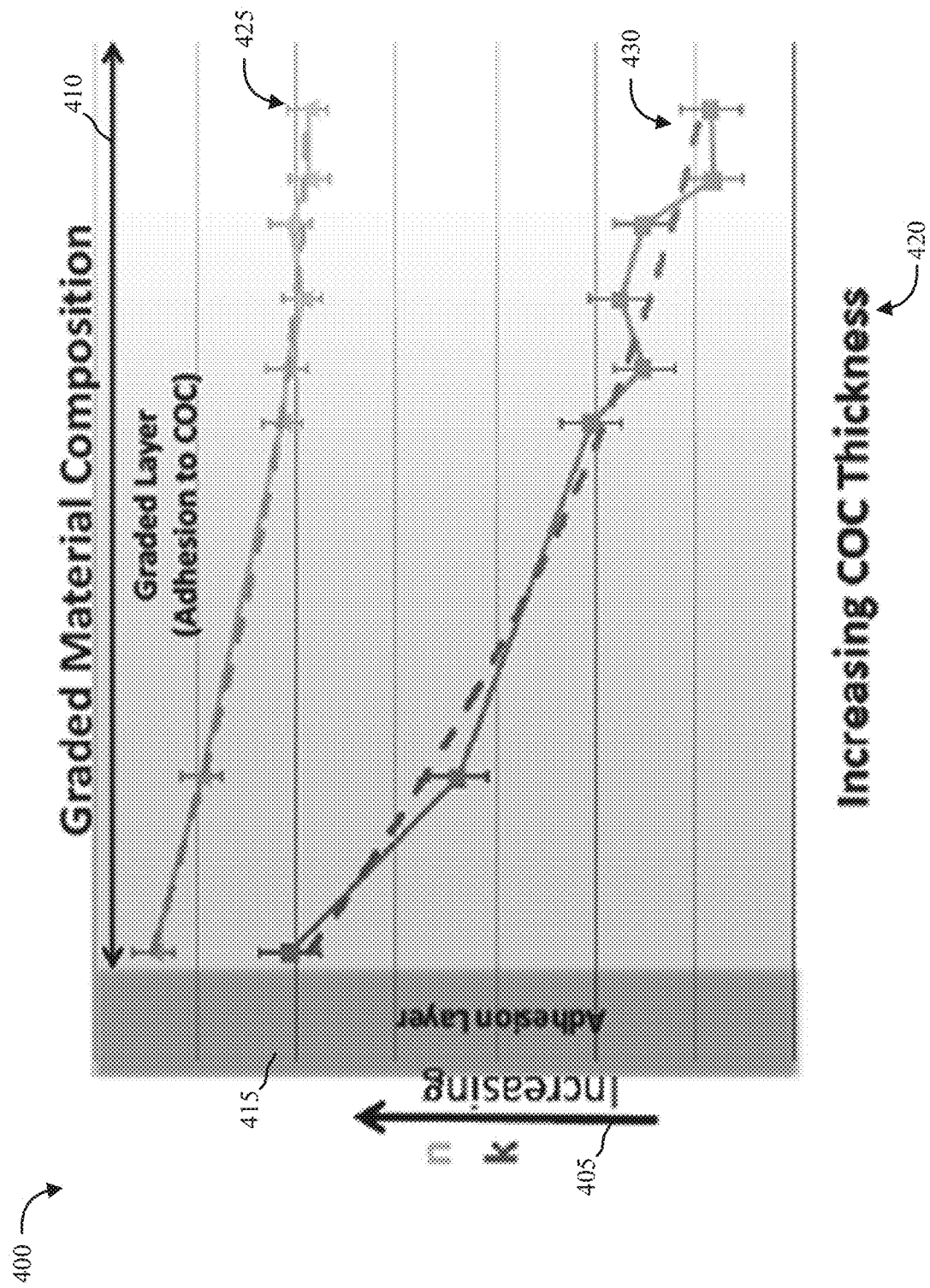
FIG. 4 shows a graph in accordance with various aspects of this disclosure.

FIG. 4 shows a graph 400. Graph 400 depicts the optical properties of a COC layer (e.g., COC layer 320) with a cap-layer (e.g., cap-layer 325), and the interfacial graded region 410 between the cap-layer and the COC layer. Graph 400 depicts the optical properties refractive index 425 (e.g., "n") and extinction coefficient 430 (e.g., "k") of the cap-layer deposited on top of a recording layer (e.g., recording layer 330) and the "graded layer" of adhesion between the cap-layer and the COC layer. Graph 400 shows the "adhesion layer" 415 (e.g., the cap-layer acting in part as an adhesive layer between a recording layer and a COC layer) at left on the graph shown with increasing "k" by arrow 405, and the increasing thickness of the COC layer 420 moving right away from the adhesion layer 415. Graph 400 shows the concomitant gradual decreases in the refractive index 425 and extinction coefficient 430 as the COC layer becomes thicker, which is a consequence of the gradual change in the cap-layer from dominant "adhesion" layer to purely COC layer.

Below is a table that depicts HAMR storage media attributes in relation to storage media with a "COC Layer Only" (e.g., a COC layer without a cap-layer) versus a "COC Layer+Cap-Layer" (e.g., a COC layer with a cap-layer).

| HAMR Media Attributes (Normalized to COC only) | COC Layer Only | COC Layer + Cap-Layer |
|---|---|---|
| Temperature Rise in COC | 1.0 | 1.027 |
| Light Power Needed to Write Storage Layer | 1.0 | 0.93 |
| Thermal Gradient in Storage Layer | 1.0 | 1.0 |
| Thermal Stress at COC/Recording Layer interface | 1.0 | ~0.0 |

As shown above, the temperature rise in the COC layer when the recording layer is at the recording temperature is approximately 3% higher for the COC layer without cap-layer than for the COC layer with cap-layer. In contrast, the light power required to write data to the storage medium is about 7% lower in the graded COC layer with cap-layer versus the COC layer without cap-layer as a consequence of the overall higher optical absorbance provided by the cap-layer. Also, the thermal stress at the interface between the COC layer and the recording layer is negligible in the case of the graded COC layer with cap-layer versus the COC layer without cap-layer.

The present techniques of a graded COC layer with cap-layer provides several benefits over a COC layer without cap-layer. For example, the COC layer with cap-layer provides an increased COC adherence to the storage medium. Also, the greater adherence of the COC layer with cap-layer provides a decreased media COC smearing on the air bearing (e.g., advance air bearing). Also, the COC layer with cap-layer provides power savings because the COC layer with cap-layer operates at a relatively lower laser power due to the increased optical absorption of the COC layer with cap-layer. Also, the COC layer with cap-layer provides an increased COC film durability and lower COC stress during HAMR writing.

Figure 5:
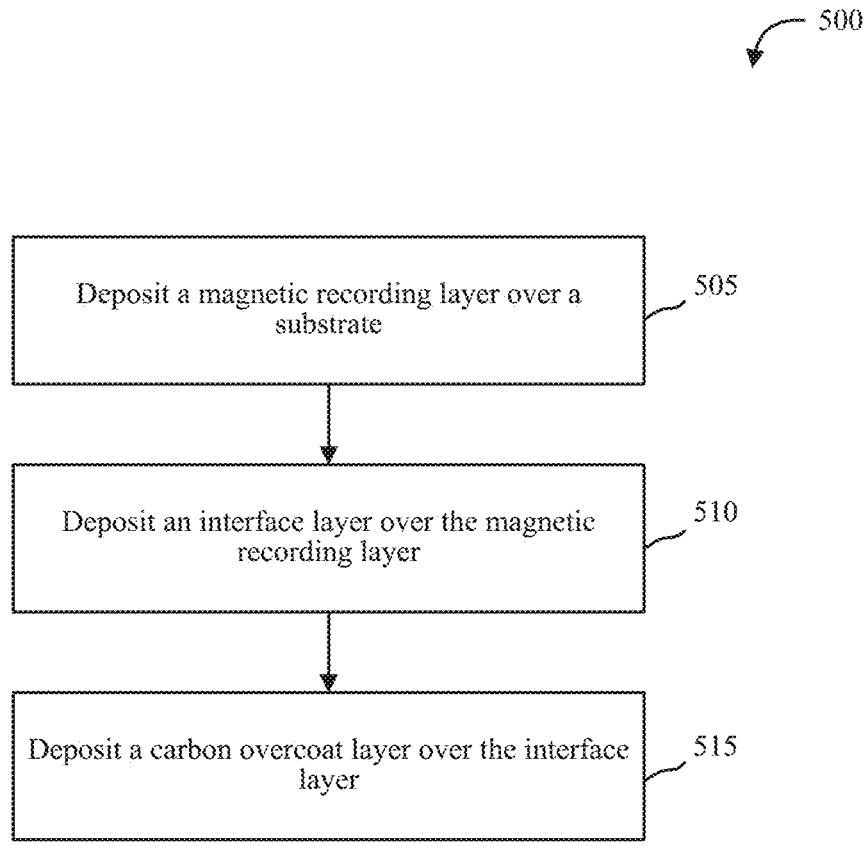
FIG. 5 is a flow chart illustrating an example of a method in accordance with various aspects of this disclosure.

FIG. 5 is a flow chart illustrating an example of a method 500 for adding a cap-layer to magnetic recording media, in accordance with various aspects of the present disclosure. One or more aspects of the method 500 may be implemented in conjunction with device 10 of FIG. 1, recording head 22 of FIG. 2, etc.

At block 505, the method 500 may include depositing a magnetic recording layer over a substrate. At block 510, the method 500 may include depositing an interface layer over the magnetic recording layer. At block 515, the method 500 may include depositing a carbon overcoat layer over the interface layer.

Figure 6:
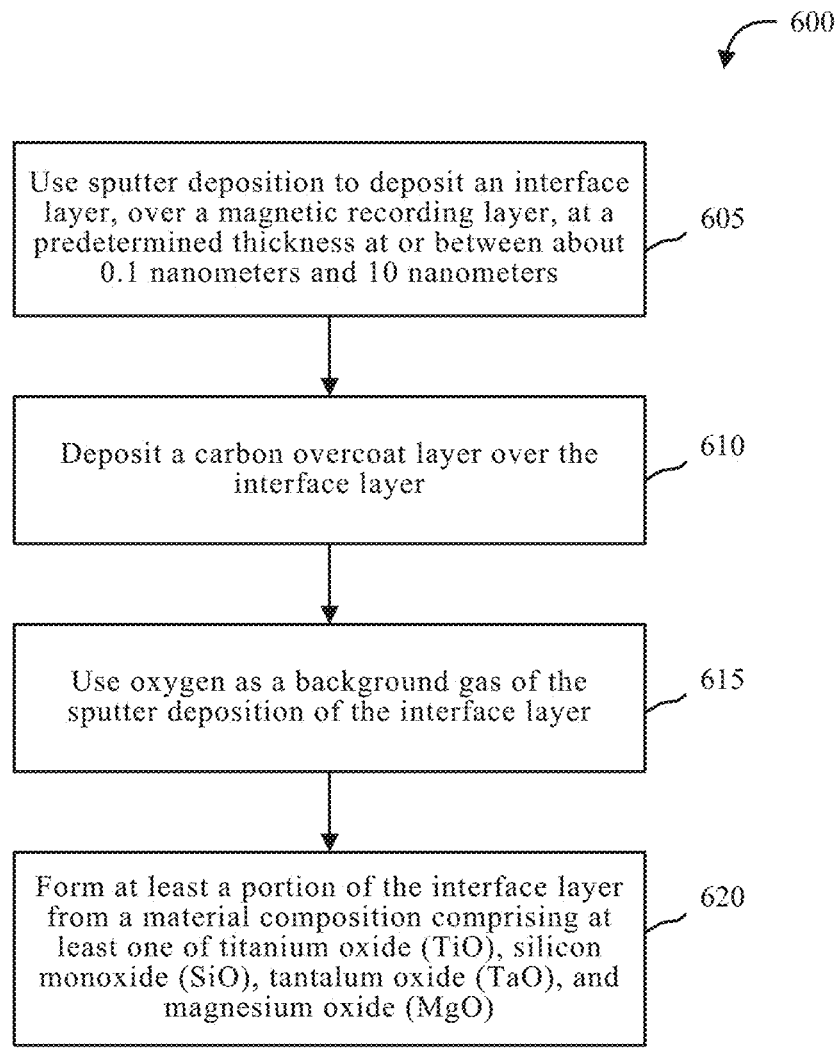
FIG. 6 is a flow chart illustrating an example of a method in accordance with various aspects of this disclosure.

FIG. 6 is a flow chart illustrating an example of a method 600 for adding a cap-layer to magnetic recording media, in accordance with various aspects of the present disclosure. One or more aspects of the method 600 may be implemented in conjunction with device 10 of FIG. 1, recording head 22 of FIG. 2, etc.

At block 605, the method 600 may include using sputter deposition to deposit an interface layer over a magnetic recording layer. In some cases, the interface layer may be deposited at a predetermined thickness at or between about 0.1 nanometers and about 10 nanometers.

At block 610, the method 600 may include depositing a carbon overcoat layer over the interface layer. At block 615, the method 600 may include using oxygen as a background gas of the sputter deposition of the interface layer. At block 620, the method 600 may include forming at least a portion of the interface layer from a material composition comprising at least one of titanium oxide (TiO), silicon monoxide (SiO), tantalum oxide (TaO), and magnesium oxide (MgO).

It should be noted that the methods 500 and 600 are just example implementations, and that the operations of the methods 500 and 600 may be rearranged or otherwise modified such that other implementations are possible.

The detailed description set forth above in connection with the appended drawings describes examples and does not represent the only instances that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with this disclosure may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, and/or state machine. A processor may also be implemented as a combination of computing devices, for example, a combination of a DSP and a microprocessor, multiple microprocessors, one or more microprocessors in conjunction with a DSP core, and/or any combination thereof.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC, or A and B and C.

In addition, any disclosure of components contained within other components or separate from other components should be considered exemplary because multiple other architectures may potentially be implemented to achieve the same functionality, including incorporating all, most, and/or some elements as part of one or more unitary structures and/or separate structures.

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM, DVD, or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, or any combination thereof, then the coaxial cable, fiber optic cable, twisted pair, DSL, or wireless technologies such as infrared, radio, and/or microwave are included in the definition of medium. Disk and disk, as used herein, include any combination of compact disk (CD), laser disk, optical disk, digital versatile disk (DVD), floppy disk and Blu-ray disk where disks usually reproduce data magnetically, while disks reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclose.

This disclosure may specifically apply to security system applications. This disclosure may specifically apply to storage system applications. In some embodiments, the concepts, the technical descriptions, the features, the methods, the ideas, and/or the descriptions may specifically apply to storage and/or data security system applications. Distinct advantages of such systems for these specific applications are apparent from this disclosure.

The process parameters, actions, and steps described and/or illustrated in this disclosure are given by way of example only and can be varied as desired. For example, while the steps illustrated and/or described may be shown or discussed in a particular order, these steps do not necessarily need to be performed in the order illustrated or discussed. The various exemplary methods described and/or illustrated here may also omit one or more of the steps described or illustrated here or include additional steps in addition to those disclose.

Furthermore, while various embodiments have been described and/or illustrated here in the context of fully functional computing systems, one or more of these exemplary embodiments may be distributed as a program product in a variety of forms, regardless of the particular type of computer-readable media used to actually carry out the distribution. The embodiments disclose herein may also be implemented using software modules that perform certain tasks. These software modules may include script, batch, or other executable files that may be stored on a computer-readable storage medium or in a computing system. In some embodiments, these software modules may permit and/or instruct a computing system to perform one or more of the exemplary embodiments disclose here.

This description, for purposes of explanation, has been described with reference to specific embodiments. The illustrative discussions above, however, are not intended to be exhaustive or limit the present systems and methods to the precise forms discussed. Many modifications and variations are possible in view of the above teachings. The embodiments were chosen and described in order to explain the principles of the present systems and methods and their practical applications, to enable others skilled in the art to utilize the present systems, apparatus, and methods and various embodiments with various modifications as may be suited to the particular use contemplated.

What is claimed is:

1. A medium for heat assisted magnetic recording, the medium comprising:
    a magnetic recording layer;
    an interface layer on the magnetic recording layer;
    a carbon overcoat layer on the interface layer;
    a graded interface structure between the interface layer and the carbon overcoat layer, the graded interface structure in contact with the interface layer and including carbon atoms and atoms from a material of the interface layer, the graded interface structure having a carbide sublayer in contact with the carbon overcoat layer.

2. The medium of claim 1, wherein at least a portion of the interface layer comprises at least one of titanium oxide (TiO), silicon monoxide (SiO), tantalum oxide (TaO), and magnesium oxide (MgO).

3. The medium of claim 1, wherein the interface layer has a thickness at or between about 0.1 nanometers and about 10 nanometers.

4. The medium of claim 1, wherein a refractive index of the interface layer is set at or between about 0.5 and about 1.6 based at least in part on a material composition used for the interface layer and a thickness of the interface layer, and wherein a refractive index of the carbon overcoat layer is set at or between about 2.0 and about 2.5 based at least in part a thickness of the carbon overcoat layer.

5. The medium of claim 4, wherein an extinction coefficient of the interface layer is set at or between about 0.3 and about 1.3 based at least in part on a material composition used for the interface layer and a thickness of the interface layer; and wherein an extinction coefficient of the carbon overcoat layer is set at or between about 0.1 and about 0.5 based at least in part a thickness of the carbon overcoat layer.

6. The medium of claim 4, wherein the refractive index of the interface layer is based at least in part on a wavelength of a laser configured to shine on the interface layer through the carbon overcoat layer, wherein the wavelength is between about 400 and about 800 nanometers.

7. A method for heat assisted magnetic recording comprising:
depositing a magnetic recording layer over a substrate;
depositing an interface layer over the magnetic recording layer; and
depositing a carbon overcoat layer over the interface layer, the carbon overcoat layer being deposited in conjunction with the interface layer to create a graded interface structure in contact with the interface layer, the graded interface structure having a carbide sublayer in contact with the carbon overcoat layer.

8. The method of claim 7, comprising:
using sputter deposition to deposit at least the interface layer.

9. The method of claim 8, comprising:
using oxygen as a background gas of the sputter deposition.

10. The method of claim 7, comprising:
forming at least a portion of the interface layer from a material composition comprising at least one of titanium oxide (TiO), silicon monoxide (SiO), tantalum oxide (TaO), and magnesium oxide (MgO).

11. The method of claim 7, wherein depositing the interface layer further comprises:
depositing the interface layer at a predetermined thickness at or between about 0.1 nanometers and about 10 nanometers.

12. The method of claim 7, comprising:
varying one or more parameters associated with the depositing of the interface layer during the depositing of the interface layer, the one or more parameters including at least one of a temperature of deposition of the interface layer, a concentration of a background gas present when the interface layer is deposited, one or more material compositions used for the interface layer, a thickness of each of the one or more material compositions, or any combination thereof.

13. The method of claim 7, comprising:
setting a refractive index of the interface layer at or between about 0.5 and about 1.6 based at least in part on a material composition used for the interface layer and a thickness of the interface layer; and
setting a refractive index of the carbon overcoat layer at or between about 2.0 and about 2.5 based at least in part a thickness of the carbon overcoat layer.

14. The method of claim 13, comprising:
setting an extinction coefficient of the interface layer at or between about 0.3 and about 1.3 based at least in part on a material composition used for the interface layer and a thickness of the interface layer; and
setting an extinction coefficient of the carbon overcoat layer at or between about 0.1 and about 0.5 based at least in part on a thickness of the carbon overcoat layer.

* * * * *